US008283702B2

(12) United States Patent
Salinas et al.

(10) Patent No.: US 8,283,702 B2
(45) Date of Patent: Oct. 9, 2012

(54) PROCESS FOR MANUFACTURING A LARGE-SCALE INTEGRATION MOS DEVICE AND CORRESPONDING MOS DEVICE

(75) Inventors: Dario Salinas, Catania (IT); Guglielmo Fortunato, Rome (IT); Angelo Magri', Belpasso (IT); Luigi Mariucci, Rome (IT); Massimo Cuscuna, Rome (IT); Cateno Marco Camalleri, Catania (IT)

(73) Assignees: STMicroelectronics S.r.l., Agrate Brianza (IT); Consiglio Nazionale delle Ricerche, Rome (IT)

( * ) Notice: Subject to any disclaimer, the term of this patent is extended or adjusted under 35 U.S.C. 154(b) by 0 days.

(21) Appl. No.: 12/794,357

(22) Filed: Jun. 4, 2010

(65) Prior Publication Data

US 2010/0237391 A1 Sep. 23, 2010

Related U.S. Application Data

(62) Division of application No. 11/604,189, filed on Nov. 22, 2006, now Pat. No. 8,030,192.

(30) Foreign Application Priority Data

Nov. 25, 2005 (EP) .................................. 05425836

(51) Int. Cl.
*H01L 29/76* (2006.01)
(52) U.S. Cl. .......... 257/213; 257/E21.475; 257/E23.114
(58) Field of Classification Search .......... 257/213–217, 257/262, 290, 335, E29.256, E29.257, E29.261, 257/E23.114, E21.475
See application file for complete search history.

(56) References Cited

U.S. PATENT DOCUMENTS

| 5,510,281 | A | 4/1996 | Ghezzo et al. |
| 5,981,343 | A | 11/1999 | Magri et al. |
| 6,475,888 | B1 * | 11/2002 | Sohn .............................. 438/535 |
| 6,844,250 | B1 * | 1/2005 | Wang et al. .................... 438/535 |
| 2003/0027412 | A1 | 2/2003 | Chen et al. |
| 2003/0123829 | A1 * | 7/2003 | Taylor ............................ 385/131 |
| 2003/0146458 | A1 | 8/2003 | Horiuchi et al. |

FOREIGN PATENT DOCUMENTS

| EP | 0902481 A2 | 3/1999 |
| EP | 1450411 A1 | 8/2004 |

OTHER PUBLICATIONS

European Search Report for European Patent Application No. 05 42 5836, dated Jun. 13, 2006.

* cited by examiner

*Primary Examiner* — Brooke Kebede
(74) *Attorney, Agent, or Firm* — Graybeal Jackson LLP

(57) ABSTRACT

A process for manufacturing a MOS device and the MOS device manufactured thereby are disclosed. The process includes in a semiconductor layer forming a gate structure above the semiconductor layer; forming a first doped region within a first surface portion of the semiconductor layer; and irradiating the first doped region with electromagnetic radiation, to carry out annealing thereof. Prior to the irradiating step, a dielectric mirror is formed above a second surface portion of the semiconductor layer. The dielectric mirror, which may be of the Bragg-reflector type, reflects at least in part the electromagnetic radiation, and protects underlying regions from the electromagnetic radiation.

22 Claims, 8 Drawing Sheets

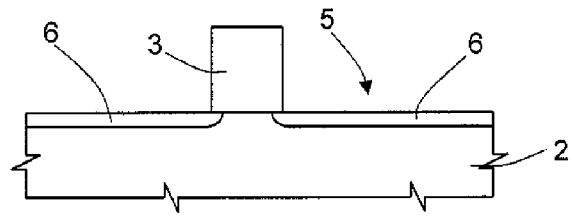
Fig.4a
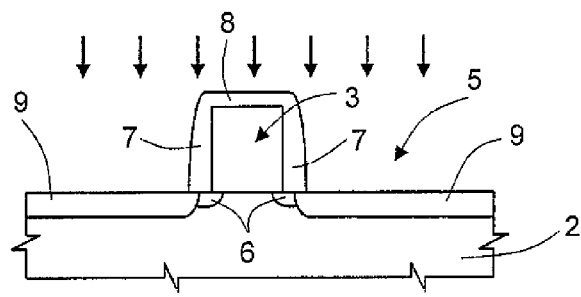
Fig.4b
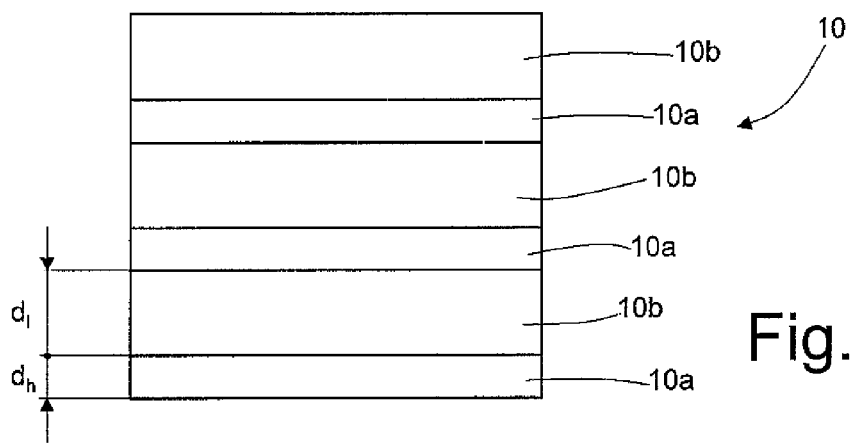
Fig.5a
| MATERIAL | n | MATERIAL | n |
|---|---|---|---|
| Cryolite-$Na_3AlF_6$ | 1.35 | Magnesium Fluoride-$MgF_2$ | 1.38 |
| Silicon Dioxide-$SiO_2$ | 1.46 | Polystyrene | 1.60 |
| Cerium Fluoride-$CeF_3$ | 1.63 | Lead Fluoride-$PbF_2$ | 1.73 |
| Silicon Monoxide-SiO | 1.95 | Zirconium Oxide-$ZrO_2$ | 2.20 |
| Zinc Sulfide-ZnS | 2.32 | Titanium Dioxide-$TiO_2$ | 2.40 |
| Bismuth Oxide-$Bi_2O_3$ | 2.45 | Silicon-Si | 3.50 |
| Germanium-Ge | 4.20 | Tellurium-Te | 4.60 |
Fig.5b

PROCESS FOR MANUFACTURING A LARGE-SCALE INTEGRATION MOS DEVICE AND CORRESPONDING MOS DEVICE

PRIORITY CLAIM

The present application is a Divisional of copending U.S. patent application Ser. No. 11/604,189, filed Nov. 22, 2006; which claims priority from European patent application No. 05425836.3, filed Nov. 25, 2005, all of the foregoing applications are incorporated herein by reference in their entireties.

TECHNICAL FIELD

The present disclosure relates to processes for manufacturing large-scale integration MOS (Metal-Oxide Semiconductor) devices, and to the corresponding MOS devices.

BACKGROUND

As is known, the advent of large-scale integration in the fabrication of MOS devices, in particular, below the level of one micron (ULSI—Ultra-Large Scale Integration), calls for a drastic reduction in the vertical and lateral dimensions of the body, source, and drain regions (the latter in the case of lateral-conduction MOS devices), so as to obtain shallow junctions or ultra-shallow junctions. These size reductions could in theory be achieved by reducing the thermal budget associated with the MOS device, but this solution is not efficient for activation of the heavily doped shallow regions that constitute the source and drain regions of the device (in what follows defined as source/drain regions in the case of a lateral-conduction device, and as source regions in the case of a vertical-conduction device).

In N-channel devices, implants are usually made with low-diffusivity dopants, such as arsenic (As), followed by a rapid thermal annealing (RTA) treatment for dopant activation. The RTA treatment enables, as compared to a traditional thermal treatment, reduction of the thermal budget of the process; however, it is not efficient in the case of high-dose implants. In particular, RTA treatment does not enable an efficient removal of the crystallographic defects due to ion implantation, which are responsible for degradation of the electrical performance of the body/drain junctions and/or of the gate oxide. In P-channel devices, the high diffusivity of the dopant boron (B) atoms, normally used for the implantation process, does not enable the formation of shallow junctions. At the same time, alternative low-diffusivity dopants, such as for example indium (In), are difficult to use for source/drain implants, due to the poor properties of electrical activation.

Conventional thermal treatments, even if rapid-annealing methods are used, do not, in any case, enable an accurate control of the dopant diffusion and are consequently not indicated for the formation of ultra-shallow doped regions, where the repeatability of the process is fundamental for precisely controlling characteristics such as threshold voltage and channel length.

In the last few years, the use of alternative techniques has consequently been proposed, in particular, excimer-laser irradiation techniques for local heating and possibly melting of silicon regions to enable rapid diffusion and activation of dopant atoms. Excimer-laser-annealing (ELA) technology enables extremely shallow doped regions (with a depth smaller than 0.1 µm) to be obtained, with excellent electrical characteristics, in particular, with an extremely small sheet resistance. FIG. 1 shows in this regard a graph illustrating the pattern of the sheet resistance Rs as the junction depth varies, in the case of traditional RTA technology (dashed line) and ELA technology (solid line), in which the boxes indicate the technological integration nodes.

In detail, excimer-laser irradiation enables melting of silicon regions having dimensions that can be controlled with extreme precision by adjusting the irradiation energy. During melting, the crystallographic defects due to ion implantation are completely eliminated, and dopants diffuse rapidly within the molten region. During a subsequent liquid-phase epitaxial process, the dopant is then incorporated in the regrowth region. Thanks to the effective thermal dissipation towards underlying silicon regions, the temperature remains sufficiently high for a solid-phase diffusion only for tens of nanoseconds, a time that is not sufficient for the occurrence of a significant transportation of dopant atoms beyond the molten region.

Even though the use of this technology in the MOS-device manufacturing process is particularly advantageous, it involves, however, considerable problems. In fact, high laser-annealing irradiation energies are required to completely melt the doped source/drain regions where a large number of implant-generated crystallographic defects are present. Consequently, there exists the risk that irradiation will cause melting and deformation of the structures that make up the MOS device. In particular, the body and source/drain implants are performed in a step subsequent to formation of gate structures (which include, in a known way, at least one region of silicon oxide surmounted by a gate electrode, normally of polycrystalline silicon), self-aligned to the gate structures or to spacers formed laterally to the gate structures.

The ELA process causes melting and deformation, in particular, of the gate electrodes, jeopardizing the electrical characteristics of the MOS device. It is consequently necessary to reach a compromise in the determination of the irradiation energy, taking into account the maximum energy that the MOS structure is able to withstand without any deformations occurring. The problem of the high energy required is moreover aggravated by the geometrical structure of the region to be irradiated. In this regard see FIG. 2, which is a schematic perspective cross-sectional view of a typical geometrical structure of a MOS device 1 of a known type. The MOS device 1 comprises: a substrate 2 having a top surface 2a; gate structures 3 (illustrated in an extremely simplified way), formed on the top surface 2a of the substrate 2, which succeed one another in a first direction x and extend, parallel to one another, in a second direction y substantially perpendicular to the first direction x; and source/drain regions (not illustrated) constituted by doped regions formed in surface portions of the substrate 2 adjacent to, and partially underlying, the gate structures 3. The source/drain regions are formed within source/drain windows 5, defined by contiguous gate structures 3 arranged in the first direction x. The source/drain windows 5 have the shape of narrow channels, for example with a width l of 600 nm and a height h of 700 nm.

The laser irradiation for annealing of the source/drain regions and activation of the respective dopants occurs in a direction normal to the top surface 2a of the substrate 2, within the source/drain windows 5. On account of the wavelike nature of the laser radiation and of the reduced dimensions of the regions to be irradiated, phenomena of optical interference with the side walls of the gate structures 3 occur, with the result that peripheral portions of the source/drain regions in the proximity of said walls receive a lower intensity of irradiation than do the central portions. The thermal difference caused by this phenomena of interference is moreover accentuated by phenomena of thermal dissipation from the aforesaid peripheral portions towards adjacent cold regions of the substrate 2, situated underneath the gate structures 3. The result is a non-uniform heating of the source/drain regions, with the temperature T varying according to the pattern illustrated in the detail of FIG. 2 within the source/drain windows 5, with a maximum at the central portions of the source/drain regions, and a minimum at the peripheral portions thereof. In order to obtain a sufficient annealing of the peripheral portions of the source/drain regions, with a complete removal of the crystallographic defects, it is consequently necessary to use a high energy density of irradiation, even higher than 1 J/cm$^2$, which causes, however, deformations of the MOS-device structure.

By way of example, FIGS. 3a and 3b show photographs taken with a transmission electron microscope (TEM) of a section of a portion of the MOS device 1. In detail, FIG. 3a corresponds to an irradiation at an energy such as not to remove completely the defects (which are in fact highlighted in the areas circled in black in FIG. 3a). In this case, minimal deformations appear in the MOS device. Instead, FIG. 3b corresponds to the use of a high irradiation energy, which indeed leads to complete elimination of the implantation defects, but also to a corresponding evident deformation of the gate structures (in particular, a lateral leakage of the gate electrode polysilicon occurs).

In an attempt to overcome the problems described above, it has been proposed, for example in U.S. Pat. No. 5,401,666, which is incorporated herein by reference, to exploit the modulation effect in the radiation transmission by layers of silicon oxide with different thicknesses. In particular, it has been proposed to coat the gate structures at the top, prior to carrying out laser irradiation, with a silicon-oxide layer having a thickness such as to have a maximum reflectivity to the laser radiation at the frequency used, in order to reduce the intensity of the laser radiation absorbed by the underlying gate electrode, and consequently limit its deformation; in addition, it has been proposed to coat the source/drain regions, where it is intended to activate the dopant, with a silicon-oxide layer of a thickness such as to have minimum reflectivity to the laser beam, and thus maximize the intensity of the laser radiation absorbed by the underlying regions. However, at the high levels of energy involved, also this solution is not sufficient to prevent deformation of the gate structures. Therefore, in the manufacturing processes of MOS transistor devices using ELA techniques, currently two distinct steps are envisaged for the implantation and activation of dopants in the source/drain regions.

In detail (FIG. 4a), after the formation of the gate structures 3 (illustrated schematically) on the substrate 2, a low-dose ion implantation is performed within the source/drain windows 5 to produce lightly doped source/drain regions 6, which are then activated via a thermal process of a traditional type, for example an RTA process. In a subsequent step (FIG. 4b), a layer of dielectric material, for example silicon oxide, is deposited, and subsequently etched in an anisotropic way (for example, by means of plasma etching), for the formation of spacers 7 at the sides of the gate structures 3 and of protection regions 8 on the gate structures 3. Then, a second ion implantation, at a high dose, is performed within the source/drain windows 5 in a way self-aligned to the spacers 7 to produce heavily doped source/drain regions 9. Next, the heavily doped source/drain regions 9 are subjected to an ELA process (indicated by the arrows) for activation and diffusion of the dopants. At the end of this process, the source/drain regions of the MOS transistor device comprise two distinct regions with different levels of doping and different vertical diffusion and having a different sheet resistance, namely: the lightly doped source regions 6, situated partially underneath the gate structures 3, which form, together with the body regions (not illustrated), the channel of the MOS transistor device; and the heavily doped source/drain regions 9, adjacent to the lightly doped source/drain regions 6, which act as low-resistivity connections with corresponding contact metallizations (not illustrated).

With the process described, the regions with a higher concentration of dopant (and hence with a greater concentration of defects) are confined, by means of the spacers, far from the channel region or from the gate region of the MOS device, and so do not limit the quality and the characteristics of the device (in fact, in a known way, said defects are harmful if located in an area corresponding to the gate or channel regions). The energy of the ELA irradiation can thus be the minimum necessary for melting the silicon and activating the dopants, without excessive concern for annealing of the crystallographic defects.

The manufacturing process described previously can be used for lateral-diffusion MOS devices, but is not, however, optimized for vertical-diffusion MOS devices (VDMOS), such as power MOS transistors or IGBTs. In this case, the presence of a single high-doping source region is advantageous for optimization of the on-resistance and of the forward transconductance of the devices. With the process described, two source regions are obtained, one of which (in an area corresponding to the channel region) has a higher sheet resistance. Furthermore, in the VDMOS, the threshold voltage is heavily dependent upon the lateral diffusion of the source regions so that it is necessary to carry out an accurate control of said diffusion in order to obtain a good repeatability of the threshold voltage value (which is something that does not occur with the process described, in which the lateral diffusion is controlled, with low precision, by means of a conventional thermal process). It would then be advantageous to use a process of laser irradiation, controllable in an accurate way, to produce a single heavily doped source region having a low sheet resistance and without any residual crystallographic defects.

SUMMARY

One embodiment of the present disclosure may provide a process for manufacturing a MOS device that will enable the aforementioned disadvantages and problems to be overcome and, in particular, that will enable exploitation of the advantages of a laser irradiation, so achieving a complete annealing of the implantation defects, and at the same time overcoming the problems due to the high energies necessary for the irradiation and the consequent risks of deformation of the MOS device structure.

BRIEF DESCRIPTION OF THE DRAWINGS

For a better understanding of the present disclosure, preferred embodiments are now described, purely by way of non-limiting example and with reference to the attached drawings, wherein:

FIGS. 4*a* and 4*b* show successive steps of a process for manufacturing a MOS device of a known type;

FIG. 5*a* is a cross-sectional view of a dielectric mirror, in particular, a Bragg reflector;

FIG. 5*b* is a table indicating the value of the refractive index in the visible of some materials that can be used for producing the dielectric mirror of FIG. 5*a*;

DETAILED DESCRIPTION

Figure 1:
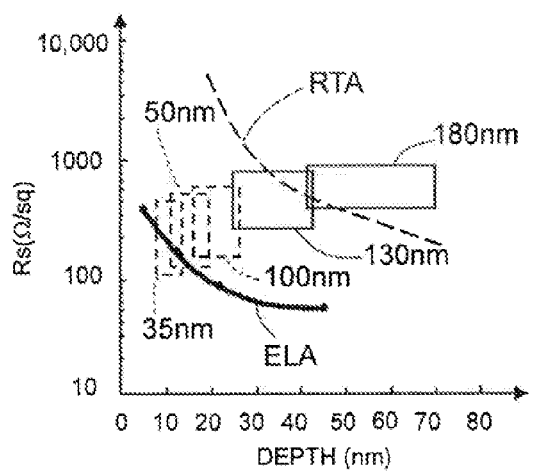
FIG. 1 shows a conventional plot of the sheet resistance as a function of a junction depth, for different annealing techniques.
Figure 2:
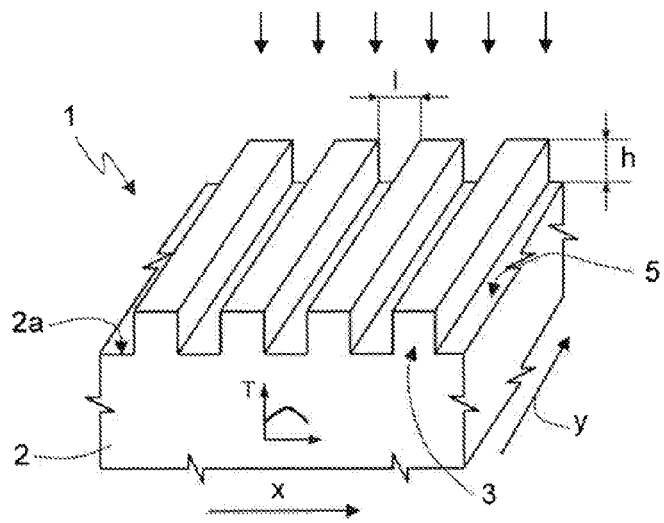
FIG. 2 is a schematic perspective cross-sectional view of the geometrical structure of a MOS device of a traditional type, which undergoes laser-irradiation annealing.
Figures 3A, 3B:
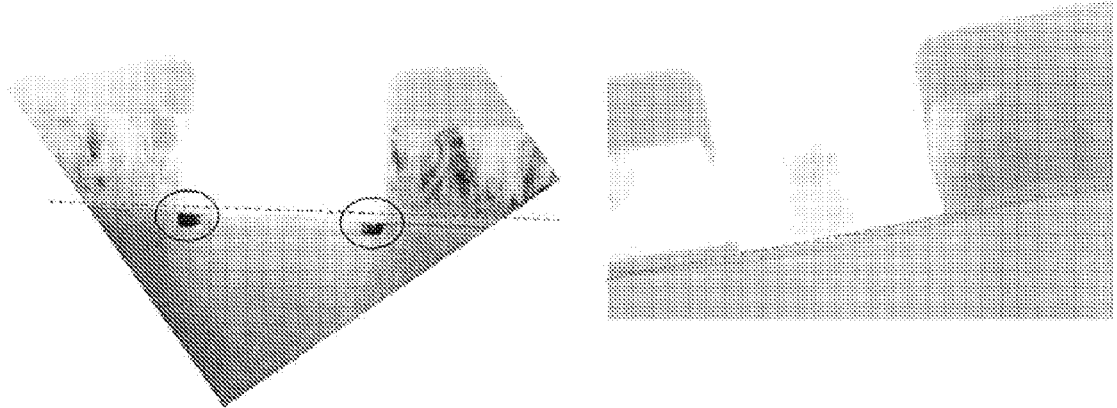
FIGS. 3a-3b show TEM cross-sectional photographs of a portion of a conventional MOS device subjected to laser irradiation at different energies.

The following discussion is presented to enable a person skilled in the art to make and use the disclosure. Various modifications to the embodiments will be readily apparent to those skilled in the art, and the generic principles herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

A general idea underlying at least some of the embodiments of the present disclosure is to use, in the manufacturing process of a MOS device, a dielectric mirror appropriately arranged and configured so as to reflect much of the incident laser radiation during a step of laser annealing so as to prevent damage to the MOS device structure. As will be described in detail hereinafter, the dielectric mirror also performs an active function of electrical insulation within the resulting MOS device.

As is known by those skilled in the art, dielectric mirrors are used in numerous optical applications, for example in the fields of laser, astronomy, and medicine, to obtain high levels of reflectivity with low losses, if compared to metal mirrors, thanks to the low absorption of the materials used. In detail, a dielectric mirror comprises a plurality of superimposed thin layers made of (usually two) different materials having different refractive indices. The reflections that are generated at the interface between the various layers, in a certain range of wavelengths, interfere constructively, generating a high overall reflectivity of the dielectric mirror (even higher than 99%).

One embodiment of the present disclosure envisages the use of a type of dielectric mirror known as a "Bragg reflector". As is known, and as illustrated in FIG. 5*a*, a Bragg reflector 10 is constituted by a sequence of identical pairs of alternating and superimposed layers made of two different materials, designated by 10*a* and 10*b*, the first having a high refractive index $n_h$ and the second a low refractive index $n_l$. The optical thickness of said layers, designated, respectively, by $n_h \cdot d_h$ and $n_l \cdot d_l$ ($d_h$ and $d_l$ being the thicknesses of the two layers) is equal to a multiple n of one quarter of the wavelength $\lambda_0$ at which it is intended to maximize the reflectivity; i.e., it is equal to $n \cdot \lambda_0 / 4$ (in the case in point, $\lambda_0$ is the frequency of the laser with which a subsequent ELA treatment is carried out). By way of example, given in the table of FIG. 5*b* is the value of the refractive index in the visible spectrum of some materials that can be used for producing the dielectric mirror. The reflectivity R of a Bragg reflector can be evaluated to a first approximation using the following relation:

$$R = \left( \frac{\left(1 - \left(\frac{n_h}{n_l}\right)^{2N} \cdot n_s\right)}{\left(1 + \left(\frac{n_h}{n_l}\right)^{2N} \cdot n_s\right)} \right)^2$$

where $n_s$ is the refractive index of a substrate (for example, silicon) on which the dielectric mirror is formed, and N is the number of pairs of layers with low and high refractive index. It is possible to carry out accurate calculations on the reflectivity R, and on the dielectric mirror in general, via purposely provided programs for the design of dielectric mirrors, such as Optilayer (www.optilayer.com) and TFCALC (www.sspectra.com), which enable, for example, ready evaluation of the reflectivity R at various wavelengths.

A process for manufacturing a large-scale integration MOS device according to a first embodiment of the present disclosure is now described.

Figure 6:
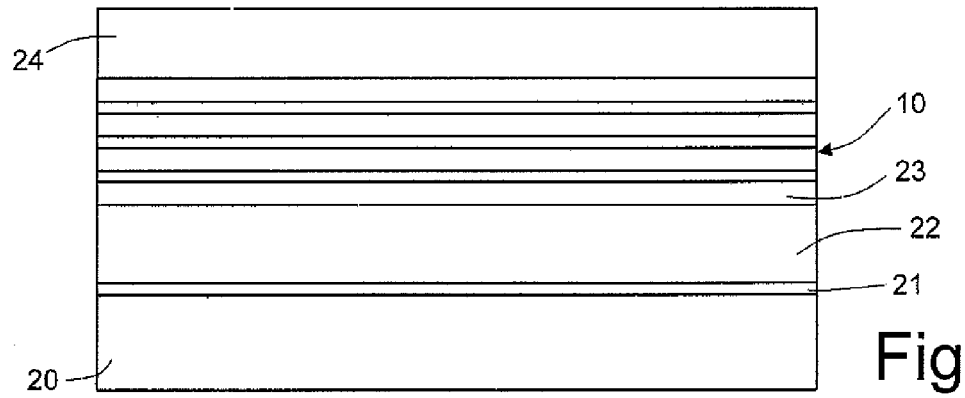
FIGS. 6-11 show sections through a wafer of semiconductor material corresponding to successive steps of a process for manufacturing a MOS device, according to a first embodiment of the present disclosure.

In detail (FIG. 6), in a first step of the manufacturing process, active areas (not illustrated) are defined (in a known manner which is not described in detail) in a layer of semiconductor material 20, for example of an N type. In the active areas, MOS transistors will be formed. Next, on the layer of semiconductor material 20 are formed in succession: a thin gate-oxide layer 21, for example with a thickness of 10-100 nm; and an appropriately doped polysilicon layer 22, which will form the gate electrodes of the MOS transistors and has a thickness, for example, of 150-600 nm. Advantageously, a layer of metallic material 23 can be formed (for example, by deposition) on the polysilicon layer 22 in order to reduce the resistance of the gate electrodes of the MOS transistors. The layer of metallic material 23 can be constituted by a metal (for example W, Mo, Ti, Ta, etc.), or else by a compound formed by silicon and a metal (for example, $CoSi_x$, $PtSi_x$, $TiSi_x$, $WSi_x$, etc.). Next, according to an embodiment of the present disclosure, a dielectric mirror 10 is formed on the layer of metallic material 23; the dielectric mirror 10 is configured to reflect an incident laser radiation during a subsequent step of laser annealing. In detail, the dielectric mirror 10 comprises, as previously indicated, a succession of identical pairs of a first mirror layer 10*a* and a second mirror layer 10*b* superimposed on one another, the number N of said pairs being a function of a desired reflectivity R and of a maximum thickness of the dielectric mirror 10, which must be compatible with the MOS structure (in particular, it must be less than 1-2 µm).

The first mirror layer 10*a* and second mirror layer 10*b* have refractive indices that are different from one another (in particular, respectively, a high refractive index $n_h$ and a low refractive index $n_l$) and are made of materials that can undergo deposition with layers of controlled thickness on the layer of semiconductor material 20, and that have a melting point higher than the one that can be reached during a subsequent process of laser annealing. The difference in refractive index between the two layers must be such that the thicknesses involved are compatible with a maximum thickness of the MOS structure resulting from the process. Furthermore, preferably, at least one between the first mirror layer 10*a* and the second mirror layer 10*b* is constituted by an insulating material in such a manner that the dielectric mirror 10 will have an insulating function within the MOS structure.

According to a particular embodiment of the present disclosure, the dielectric mirror 10 is a Bragg reflector; namely, the optical thickness of the first mirror layer 10a and of the second mirror layer 10b is equal to a multiple of a quarter of the wavelength $\lambda_0$ of the excimer laser that will be used for the subsequent annealing step (in particular $\lambda_0$ is 308 nm when the laser used is an XeCl laser). The materials used in producing the dielectric mirror must not be absorbent to the laser radiation. For example, the first mirror layer 10a can be constituted by silicon oxide $SiO_2$ and have a thickness equal to 52 nm ($n(SiO_2)$=1.485 at 308 nm), and the second mirror layer 10b can be constituted by silicon nitride $Si_3N_4$ and have a thickness equal to 38 nm ($n(Si_3N_4)$=2 at 308 nm). Furthermore, the number N of pairs of layers constituting the dielectric mirror 10 is, for example, less than five, advantageously equal to three. A buffer layer 24 is then formed (for example, by deposition) on the dielectric mirror 10; also the buffer layer 24 is not absorbent to laser radiation and preferably comprises one of the two materials of which the dielectric mirror 10 is made, and has an optical thickness equal to $n \cdot \lambda_0/2 - n_c d_c$, where $n_c$ and $d_c$ are, respectively, the refractive index and the thickness of a capping layer that will be subsequently formed on the dielectric mirror 10. Furthermore, the buffer layer 24 must be readily removable with etching processes compatible with the remaining structure. The buffer layer 24 can be formed sequentially after the formation of the dielectric mirror 10 and, in the case where the buffer layer 24 is made of the same material constituting the last layer of the dielectric mirror 10, it will simply be a matter of growing as final layer of the dielectric mirror, a layer having a total optical thickness equal to $\lambda_0/4 + n \cdot \lambda_0/2 - n_c d_c$.

Figure 7:
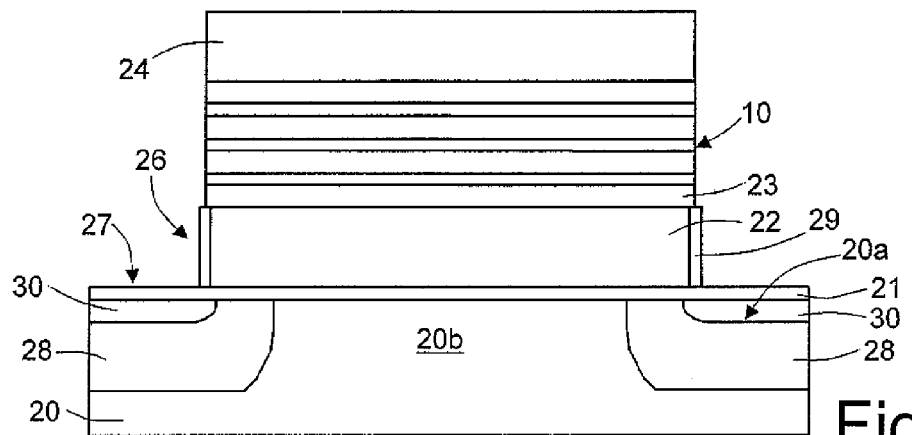

Next (FIG. 7), through a suitable mask, a selective anisotropic etch (dry etch) is carried out of the buffer layer 24, of the superimposed layers constituting the dielectric mirror 10, of the metallic layer 23 (if present), and of the polysilicon layer 22 so as to define: gate structures 26 (illustrated by way of example in FIG. 7 is just one of said gate structures 26) of the MOS device, which are surmounted by the dielectric mirror 10; and source/drain windows 27 set between adjacent gate structures 26 in an area corresponding to which ion implants of source/drain regions of the MOS device will be performed. A first ion implant is then performed within the source/drain windows 27, for example of a P type with boron atoms (B), with a dose of $10^{13}$-$10^{14}$ atoms/cm$^2$ and an energy of between 20 keV and 150 keV, in order to form body wells 28 in a first surface portion 20a of the layer of semiconductor material 20, in a position adjacent to, and partially underneath, the gate structures 26. The previously implanted dopant atoms are activated with a conventional thermal process, for example having a duration of 30 minutes at a temperature of 900-1050° C. In particular, the thermal process is carried out in an oxidizing environment so as to cause an oxidation of side walls of the polysilicon electrode 22 and the formation of oxide regions 29 at the sides thereof. Then, after regions of the layer of semiconductor material 20 that are to undergo a source/drain implant have possibly been defined via an appropriate masking, a second ion implantation is performed, at a high dose, in the example of an N type with atoms of arsenic (As) or phosphorus (P) with a dose of $10^{14}$-$10^{15}$ atoms/cm$^2$ and an energy of between 20 keV and 80 keV, in order to form source/drain regions 30 within the body wells 28, in a position adjacent to the gate structures 26.

Figure 8:
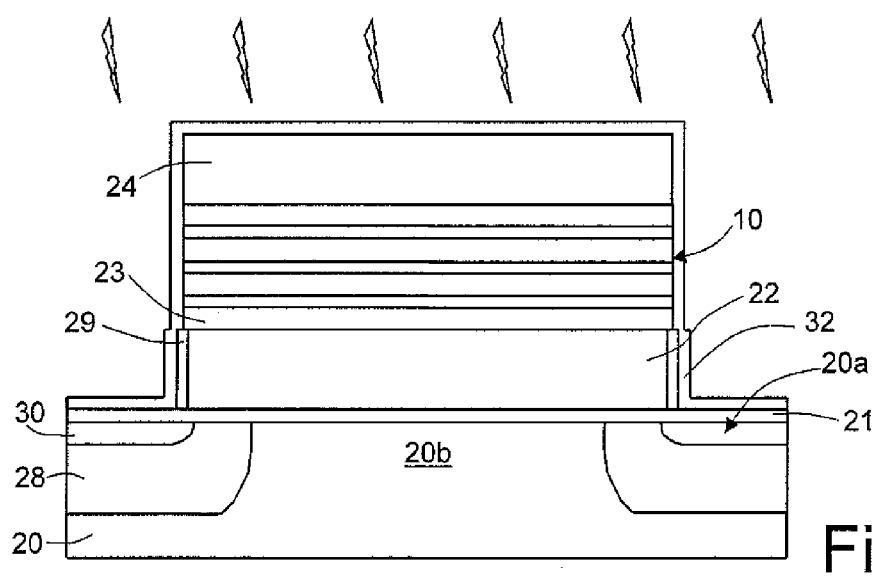

Next (FIG. 8), a capping layer 32 is deposited on the structures previously formed; the capping layer 32 is conformable and not absorbent to the laser radiation, and has the functions of improving the energy coupling with the laser beam of the implanted source/drain areas in the subsequent step of annealing and of containing any possible lateral deformations of the gate structure. As anticipated, the capping layer 32 has a thickness $d_c$ and a refractive index $n_c$, and the thickness of the buffer layer 24 previously defined is equal to $n \cdot \lambda_0/2 - n_c d_c$. Consequently, the combined presence of the capping layer 32 and of the buffer layer 24 does not alter the optical properties of the dielectric mirror 10, and, in particular, does not reduce the reflectivity thereof. In fact, the total optical thickness overlying the dielectric mirror 10 is equal to $n \cdot \lambda_0/2$, and, as is known, optical thicknesses of $n \cdot \lambda_0/2$ are neutral to a radiation having a wavelength $\lambda_0$. For example, in the case where the buffer layer 24 and the capping layer 32 are both made of silicon oxide, by choosing a thickness $d_c$ equal to 47 nm two effects can be obtained simultaneously: that of minimizing the reflectivity of the surface of the source/drain areas at the wavelength of 308 nm, and that of leaving the reflectivity of the dielectric mirror 10 unaltered. Likewise, in the case where both the buffer layer and the capping layer are made of silicon nitride, it is advantageous to choose a thickness $d_c$ of the capping layer 32 equal to 33 nm to minimize the reflectivity of the source/drain areas at the wavelength of 308 nm, and a thickness of the buffer layer 24 equal to 43 nm to maintain the reflectivity of the dielectric mirror 10 unaltered.

In general, the capping and buffer layers can also be made of materials that are different from one another, and in turn different from the ones used in producing the dielectric mirror 10, albeit guaranteeing the required dual function of improving the energy coupling with the laser beam and of not appreciably reducing the reflectivity of the dielectric mirror. An advantageous configuration is that whereby the capping layer 32 is made of silicon nitride with a thickness of 33 nm, in order to minimize the reflectivity of the source/drain areas, and the buffer layer 24 is made of silicon oxide. In this case, with an appropriate thickness of the buffer layer 24 (in particular equal to 56 nm), it is possible to increase the reflectivity of the dielectric mirror 10, in particular by approximately 3% (from 94.5% to 97.3%), at the wavelength of 308 nm and for the three-pair configuration. This occurs in so far as the pair constituted by the buffer layer and the capping layer acts as a further pair of the dielectric mirror 10, even though the optical thicknesses of the layers are not exactly equal to $\lambda_0/4$. It is to be moreover noted that this apparently small percentage increase in the reflectivity of the dielectric mirror leads to an appreciable percentage decrease (50%) in the transmitted radiation.

Next, an ELA treatment is carried out, for example with an XeCl excimer laser with a wavelength $\lambda_0$ of 308 nm and an energy density of between 700 mJ/cm$^2$ and 1200 mJ/cm$^2$, for carrying out diffusion and annealing of the source/drain regions 30 previously implanted. In particular, during the irradiation, the dielectric mirror 10 reflects a fair share of the incident radiation, protecting the underlying gate structures 26, and an underlying second surface portion 20b of the layer of semiconductor material 20 (adjacent to, and distinct from, the first surface portion 20a), in this way preventing their deformation. It is thus possible to use a high irradiation energy, and obtain a complete removal of the crystallographic defects. Next, the capping layer 32 can be removed, in the case where it comprises conductive material.

Figure 9:
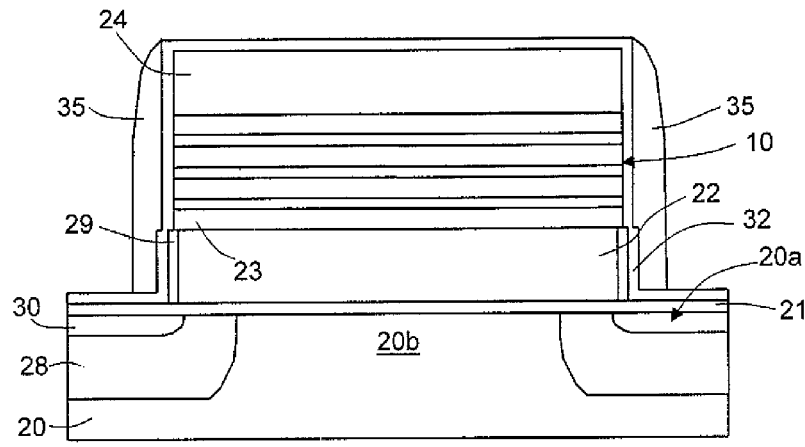

Subsequently (FIG. 9), on the structures previously defined, a dielectric layer (or dielectric multilayer) is formed, for example made of silicon oxide, silicon nitride, or a combination of silicon nitride and silicon oxide. This dielectric layer is etched in an anisotropic way so as to provide first spacers 35 at the sides of the gate structures 26 and of the dielectric mirror 10. The manufacturing process proceeds then with the formation of the source/drain contacts of the MOS device.

In this regard (FIG. 10), according to a first variant of this process, the implantation area of the source/drain regions 30 is previously defined via an appropriate masking in such a way that the source/drain regions 30 have a lateral extension smaller than the entire lateral extension of the body wells 28. Then, a further etch of the layers still present on the source/drain regions 30 is carried out, namely, of the capping layer 32 and of the gate-oxide layer 21, and a cleaning of the source/drain contact is performed. Finally, the contact thus defined is filled with one or more metal contact layers 37 so as to form the electrical source/drain contact of the MOS device and moreover make a short circuit between body and source.

Figure 11:
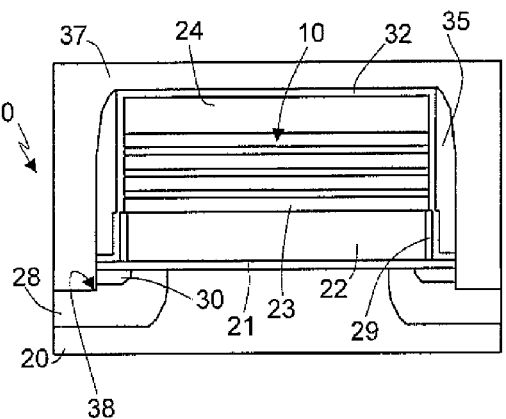

According to an alternative variant of this process, FIG. 11, the source/drain contact is obtained not by means of a photomasking process, but by resorting to digging of a trench in the layer of semiconductor material 20 (a technique known as "micro-trench technique" or "shallow-trench technique"). In particular, after the formation of the first spacers 35, a further chemical etch of the layers still present on the source/drain regions 30 is carried out (i.e., the capping layer 32 and the gate-oxide layer 21), and also of part of the silicon of the layer of semiconductor material 20, using the first spacers 35 as hard-mask. The etch is calibrated in order to dig a trench 38 having a depth greater than the depth of the source/drain regions 30. The metal contact layer 37 fills the trench 28, in this way short-circuiting body and source.

Figure 10:
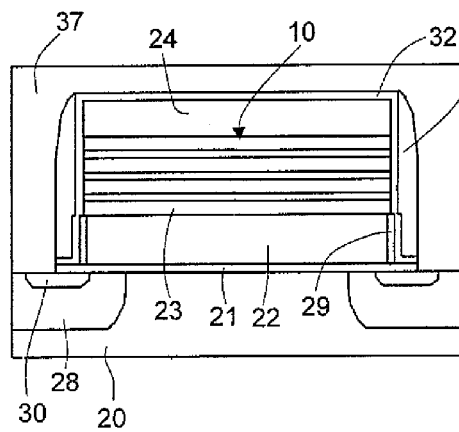

In either case, the final structure is obtained (except for subsequent known finishing steps) of the MOS device 40 illustrated in FIG. 10 or FIG. 11, in which the dielectric mirror 10 performs an active function of electrical insulation between the gate electrodes, constituted by the regions of the polysilicon layer 22 that have remained after the etches described, and the source/drain electrodes, constituted by the metal contact layer 37. This structure can be advantageously used in all planar MOS structures, whether they are vertical-conduction ones (for example, power MOSs, IGBTs, MCTs) or lateral-conduction ones (NMOSs, PMOSs, CMOSs).

A second embodiment of the present disclosure envisages a different use and a different arrangement of the dielectric mirror 10 during the manufacturing process of the MOS device. Anyway, as will emerge clearly from what follows, also in this case, the dielectric mirror 10 has the function of reflecting a fair share of the laser radiation incident on the structure of the MOS device during the step of laser annealing so as to prevent deformations of the structure and not jeopardize the electrical characteristics of the MOS device.

Figure 12A:
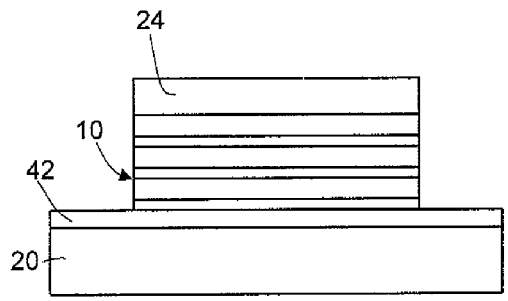
FIGS. 12*a*, 12*b* show variants of an initial step of a process for manufacturing a MOS device, in accordance with a second embodiment of the present disclosure.
Figure 12B:
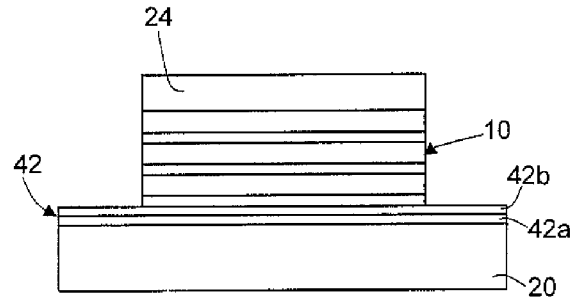

In detail (FIGS. 12a-12b) after the definition of the active areas, an end point layer 42 is formed (via growth or deposition) on the layer 20; the end point layer 42 is either single-layer (FIG. 12a) or multilayer (FIG. 12b), and is made up, in this latter case, of a first end point layer 42a made of silicon oxide, having a thickness of 5-50 nm, and a second end point layer 42b made of polysilicon, having a thickness of 10-100 nm. Then, as described previously, the dielectric mirror 10 is formed, in particular, of the Bragg-reflector type, on the end point layer 42. In particular, in the specific case of a dielectric mirror 10 made with alternating layers of silicon oxide and silicon nitride, the end point layer 42 is advantageously made up of the first end point layer 42a and the second end point layer 42b. Then, a buffer layer 24 is deposited, having an optical thickness equal to $n \cdot \lambda_0/2 - n_c d_c$, where $n_c$ and $d_c$ are, respectively, the refractive index and the thickness of a capping layer that will be subsequently formed (in a way similar to what has been described previously). Next, a masking and a selective anisotropic etch of the buffer layer 24 and of the layers that make up the dielectric mirror 10 are carried out, said etch stopping on the end point layer 42.

Figure 13:
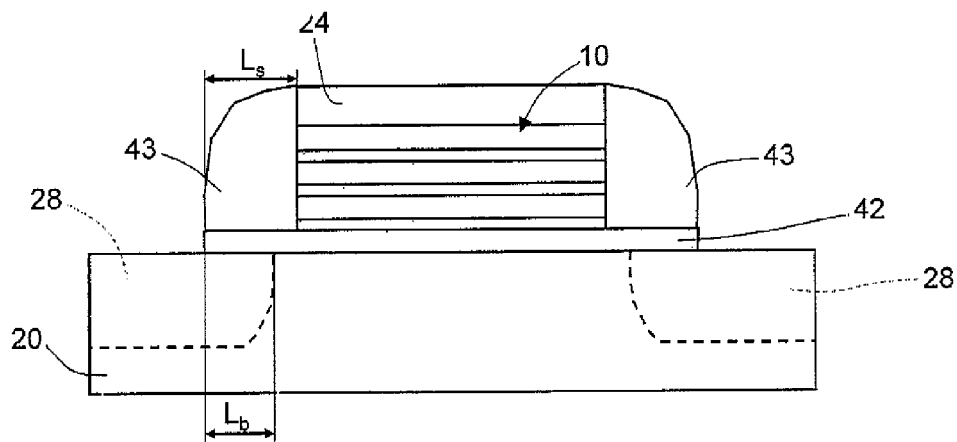
FIGS. 13-18 show subsequent steps of the process in accordance with the second embodiment of the present disclosure.

A dielectric layer (for example, made of silicon oxide or silicon nitride) is then deposited, and subsequently etched (FIG. 13) for the formation of second spacers 43 in a position adjacent to the side walls of the dielectric mirror 10. In particular, for reasons that will emerge clearly from what follows, the thickness of the deposited dielectric layer must be such that the width at the base of the second spacers 43 (designated by $L_s$ in FIG. 13) is greater than or equal to an extension (designated by $L_b$) of a lateral diffusion of a body well 28 that will be formed in a subsequent process step (and that for said reason is illustrated with a dashed line in FIG. 13). Furthermore, if necessary for carrying out subsequent ion implants, the end point layer 42 can be etched, where it is not covered by the second spacers 43 (as illustrated in FIG. 13).

Figure 14:
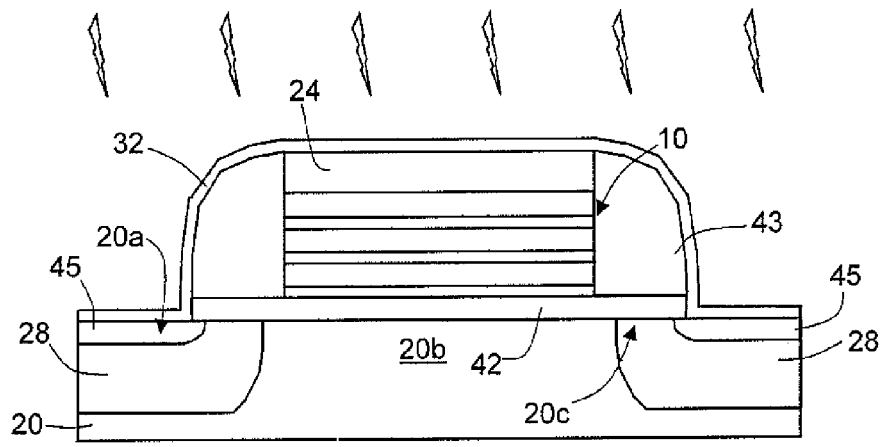

Then (FIG. 14), within the first surface portion 20a of the layer of semiconductor material 20, a first ion implantation is performed, for example of a P type with boron (B) atoms, with a dose of $10^{13}$-$10^{14}$ atoms/cm² and an energy of between 20 keV and 150 keV, in order to form the body wells 28 in a way self-aligned to the second spacers 43. As mentioned previously, the body wells 28 diffuse laterally partially underneath the second spacers 43 for an extension $L_b$ that is smaller than the width at the base $L_s$ of the second spacers 43 in such a way as not to reach the region underlying the dielectric mirror 10 (second surface portion 20b). The previously implanted dopant atoms are then activated with a conventional thermal process, for example of the duration of 30 minutes at a temperature of 900-1050° C.

After possibly defining, via an appropriate masking, the regions of the layer of semiconductor material 20 that are to undergo the source implant, a second ion implantation is performed, at a high dose, in the example in question of an N type with atoms of arsenic (As) or phosphorus (P) at a dose of $10^{14}$-$10^{15}$ atoms/cm² and with an energy of between 20 keV and 80 keV, in order to form source regions 45 within the body wells 28 at the sides of the second spacers 43. Next, on the structures previously formed, a conformable capping layer 32 is deposited, which has the function of improving the energy coupling with the laser beam in the subsequent annealing step.

As described previously, the presence of said capping layer must not reduce the reflectivity of the dielectric mirror. An ELA treatment is then carried out, for example with an XeCl excimer laser with a wavelength λ of 308 nm and an energy density of between 700 mJ/cm² and 1200 mJ/cm², for carrying out diffusion and annealing of the previously implanted source regions 45. In particular, during said irradiation step, the dielectric mirror 10 reflects much of the incident radiation so as to prevent deformation of the underlying structures of the MOS device and, in particular, of the end point layer 42 and the second surface portion 20b of the layer of semiconductor material 20. Furthermore, a third surface portion 20c of the layer of semiconductor material 20, in which the channel area of the MOS devices is situated, underlying the second spacers 43, is shielded from the laser radiation by the presence of the polysilicon in the end point layer 42 (in particular, in the second end point layer 42b). Possible deformations of the end point layer 42 induced by the laser irradiation are limited to the areas not covered by the dielectric mirror 10 and are in any case of no influence, in so far as the end point layer above the third surface portion 20c is removed in the subsequent process steps.

Furthermore, the dielectric mirror 10, by blocking the incident laser radiation, causes the annealing of the implanted regions (entailing the melting and subsequent re-solidification of the semiconductor material) to be effectively limited to the areas of interest (source regions 45) and not to spread to the portions of the layer of semiconductor material 20 situated underneath the dielectric mirror 10 (with the risk of jeopardizing operation of the MOS device). Once again, given the high energy of the laser radiation, it is possible to obtain a complete removal of the crystallographic defects due to the preceding ion implantation. Next, the capping layer 32 can be removed.

Figure 15:
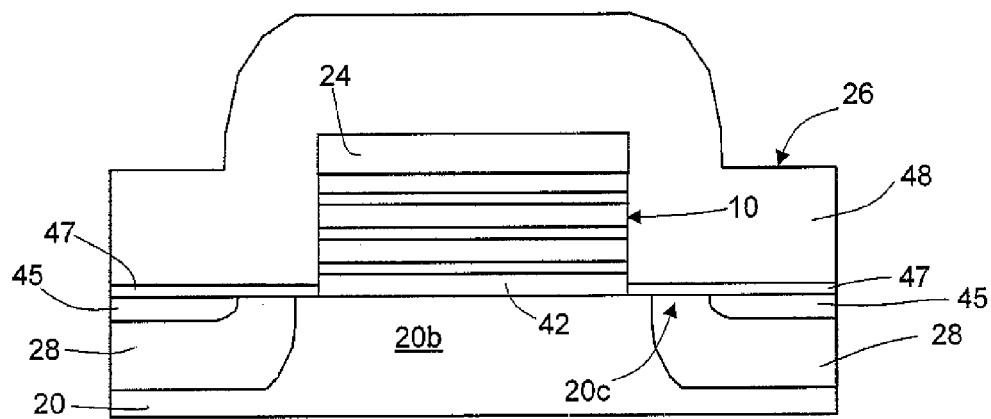

Then (FIG. 15), an isotropic etch of the second spacers 43 and of the end point layer 42 underlying the second spacers 43 is carried out, and a gate-oxide layer 47 is formed (by either growth or deposition) in a position adjacent to the sides of the dielectric mirror 10. According to an alternative embodiment, in the case where the end point layer 42 is a multilayer, the etch can concern only the second end point layer 42b of polysilicon that may have been damaged during the step of laser irradiation, and the first end point layer 42a can be used as gate oxide of the MOS device. In this case, the manufacturing process may not contemplate the dedicated step of formation of the gate-oxide layer 47. In any case, a polysilicon layer 48, possibly doped, is then formed (for example, by deposition) for making the gate electrodes of the MOS device and thus forming the gate structures 26.

Figure 16:
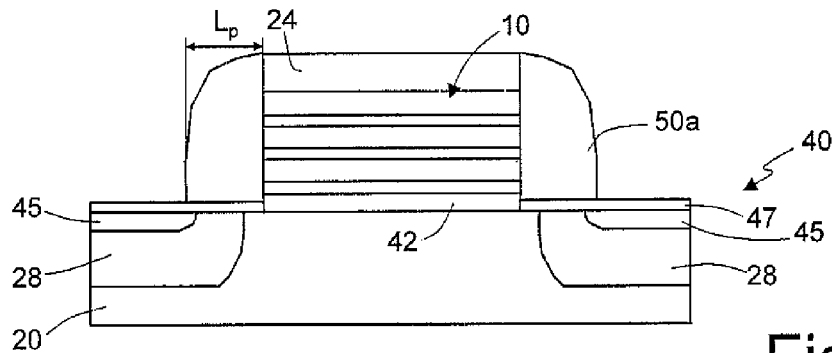

At this point, a step of photomasking to define the geometries of the polysilicon and a step of selective anisotropic etching of the polysilicon layer 48 are performed. According to the structure of a resist mask 49 (FIGS. 16-18) used for this purpose, it is possible to obtain three different final structures (except for further finishing steps) of the MOS device 40.

According to a first variant (FIG. 16), the resist mask 49 is not present in the area in which the active area of the MOS device is formed, but only on the service areas of the edge termination (not illustrated) and of the gate contact pads (which are not illustrated either). The anisotropic etch of the polysilicon layer 48 thus determines the formation of first gate portions 50a at the sides of the dielectric mirror 10, which act as gate electrodes of the MOS device. In particular, the width at the base of said first gate portions 50a, designated by $L_p$, must be greater than or equal to the width at the base $L_s$ of the second spacers 43, in such a way that the gate electrodes overlie a portion of a respective source region 45. The thickness of the polysilicon layer 48 is then constrained to the dimensions of the implant spacers and thus of the lateral diffusion of the body wells. Furthermore, the dielectric mirror 10 insulates the first adjacent gate portions 50a from one another.

Figure 17:
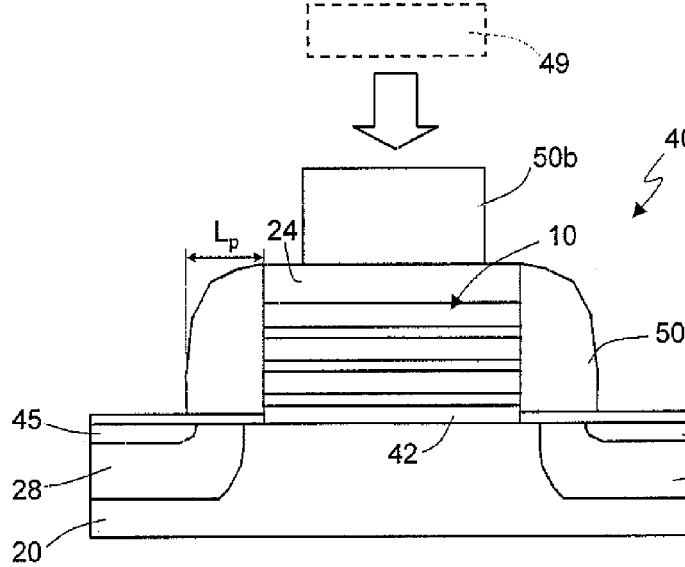
Figure 18:
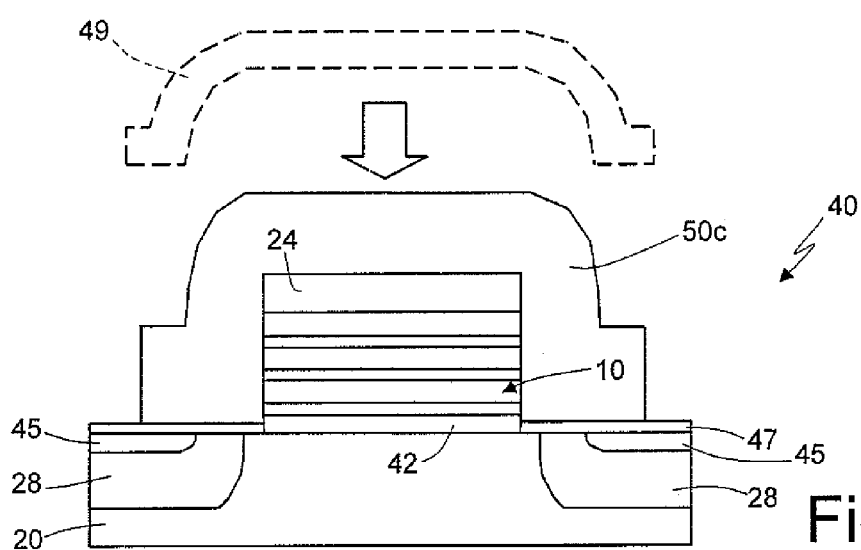

In accordance with a second variant (FIG. 17), the resist mask 49 is present in the active area and coats a portion of the polysilicon layer 48 inside the area superimposed on the dielectric mirror 10 (the resist mask 49 is illustrated with a dashed line in FIG. 17 so as to highlight the regions involved in the etch). In this case, following upon the selective etch, further second gate portions 50b are formed on the dielectric mirror 10 (in addition to the first gate portions 50a), and a further conductive path of the polysilicon is thus created, which can be appropriately used for reducing the internal gate resistance of the MOS structure (in a known way which is described, for example, in the Italian Patent Application No. MI2004A002244, filed on Nov. 19, 2004, which is incorporated herein by reference). Also in this case, the thickness of the polysilicon layer 48 is constrained by the lateral diffusion of the body wells 28.

According to a third variant (FIG. 18), the resist mask 49 coats the entire dielectric mirror 10 and extends until part of the source regions 45 is coated, so that, following upon etching, a single gate portion 50c is formed above the dielectric mirror 10 and surrounding the dielectric mirror 10 laterally. This solution enables the thickness of the polysilicon layer 48 to be independent of the lateral diffusion of the body wells, but, on the other hand, calls for a perfect alignment between the resist mask 49 and the mask that has defined the dielectric mirror 10. Furthermore, said solution, in the case where the polysilicon layer 48 is coated with a further dielectric layer of appropriate thickness (in a way not illustrated), lends itself to the production of self-aligned contacts (in a known way which is described, for example, in U.S. Pat. No. 5,981,343).

A third embodiment of the present disclosure envisages a use of the dielectric mirror 10 similar to that of the second embodiment, but with some variants in the processes of definition of the body wells 28 and of the source regions 45.

Figure 19:
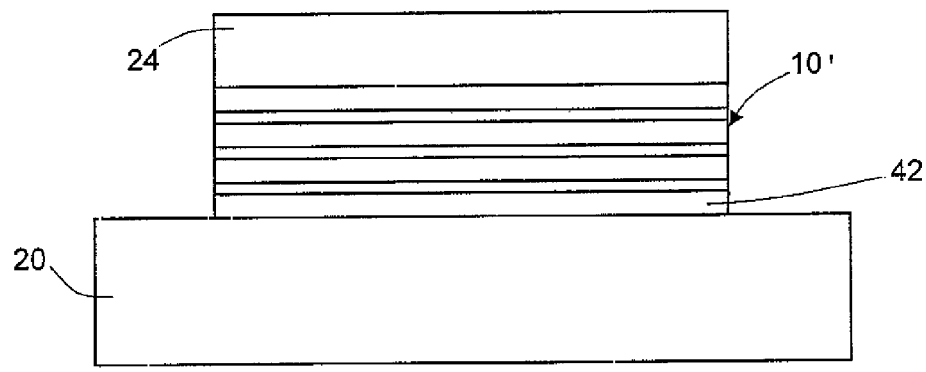
FIGS. 19-23 show sections through a wafer of semiconductor material corresponding to successive steps of a process for manufacturing a MOS device, according to a third embodiment of the present disclosure.

In detail (FIG. 19), after definition of the active areas, the single-layer or multilayer end point layer 42 is formed on the layer 20. As described previously, on the end point layer 42 a temporary dielectric mirror 10' (the reason for said definition will emerge clearly from what follows), and the buffer layer 24 having characteristics such as not to alter the reflectivity of the temporary dielectric mirror 10' are formed. Next, a masking and a selective anisotropic etch of the buffer layer 24 and of the layers that make up the temporary dielectric mirror 10' are carried out, with the etch arresting at the end point layer 42. The end point layer 42 is then removed from the areas not masked by the dielectric mirror.

Figure 20:
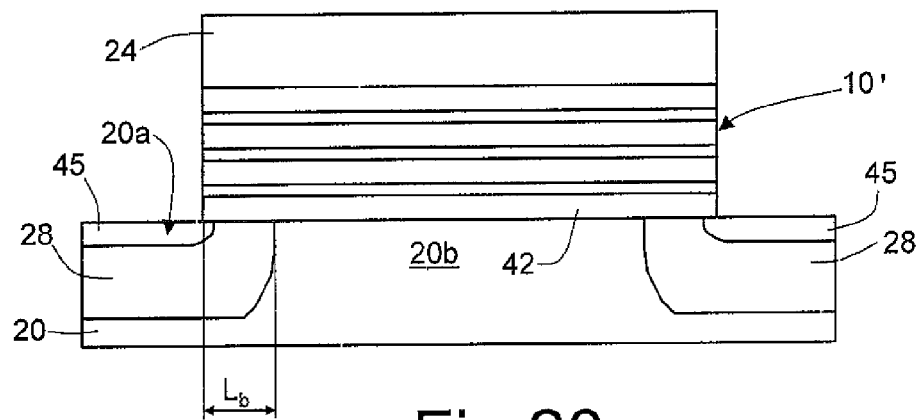

Then (FIG. 20), at the first surface portion 20a of the layer of semiconductor material 20, a first ion implantation is performed, for example of a P type with boron (B) atoms at a dose of $10^{13}$-$10^{14}$ atoms/cm$^2$ and with an energy of between 20 keV and 150 keV in order to form the body wells 28 in a way self-aligned to the temporary dielectric mirror 10'. The previously implanted dopant atoms are then activated with a conventional thermal process, for example having the duration of 30 minutes at a temperature of 900-1050° C. During the annealing process, the body wells 28 diffuse laterally partially underneath the temporary dielectric mirror 10' for an extension $L_b$ (defining the second surface portion 20b underneath the temporary dielectric mirror 10', as the area not involved in said diffusion). After possible definition, via an appropriate masking, of the regions of the layer of semiconductor material 20 that are to undergo the source implant, a second ion implantation is performed at a high dosage, in the example of an N type with atoms of arsenic (As) or phosphorus (P) at a dose of $10^{14}$-$10^{15}$ atoms/cm$^2$ and with an energy of between 20 keV and 80 keV, in order to form the source regions 45 within the body wells.

Figure 21:
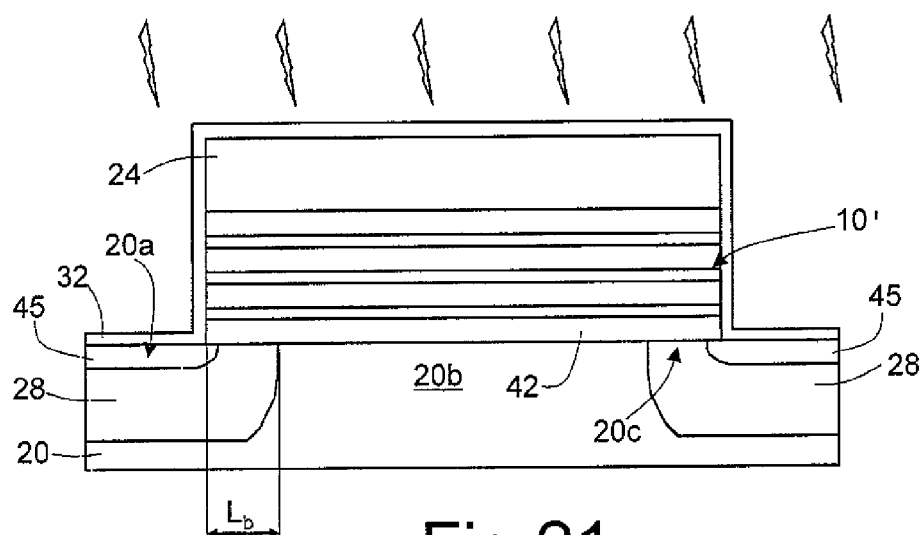

Next, a conformable capping layer 32 is deposited on the structures previously formed (FIG. 21); the conformable capping layer 32 has the purpose of minimizing the reflectivity of the surface of the source/drain areas at the wavelength that will be used for irradiation and of leaving the reflectivity of the temporary dielectric mirror 10' unaltered, the combined optical thickness of the buffer and capping layers being equal to $n \cdot \lambda_0/2$. An ELA treatment is then carried out, for example with an XeCl excimer laser at a wavelength λ of 308 nm and with an energy density of between 700 mJ/cm$^2$ and 1200 mJ/cm$^2$, for carrying out the diffusion and the annealing of the previously implanted source regions 45. During said irradiation step, the temporary dielectric mirror 10' reflects a fair share of the incident radiation so as to prevent deformation of the underlying structures of the MOS device, and in particular of the end point layer 42, of the second surface portion 20b of the layer of semiconductor material 20, and of the channel region defined by the lateral diffusion of the body well 28 (third portion 20c of the layer of semiconductor material 20). Next, the capping layer 32 is removed.

Figure 22:
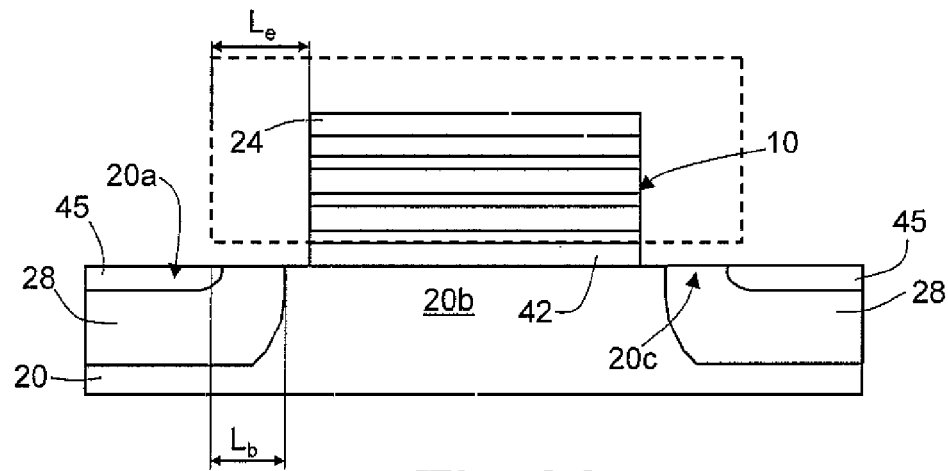

Then (FIG. 22), an isotropic etch of the buffer layer 24 and of the layers that make up the temporary dielectric mirror 10' is carried out so as to reduce their dimensions and form the dielectric mirror 10 (which will remain in the final structure). The etch can be carried out using just one solution, etching the various layers simultaneously, or by means of successive etches with solutions dedicated to the various each materials. In particular, the duration of the etch is calibrated so as to reduce a main dimension of the temporary dielectric mirror 10' (in particular, a dimension in a direction parallel to the surface of the layer of semiconductor material 20) by a distance $L_e$ (for each side) greater than or equal to the extension $L_b$ of the lateral diffusion of the body well 28. Then, it is possible to eliminate, if necessary, the buffer layer 24.

Figure 23:
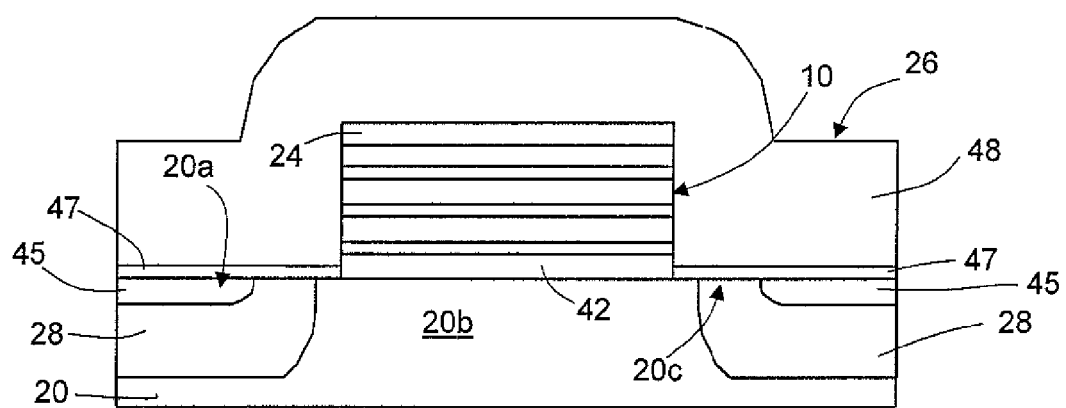

Next, the gate-oxide layer 47 is formed, via growth or deposition (FIG. 23) in an adjacent position at the sides of the dielectric mirror 10. As described previously, in the case where the end point layer 42 is a multilayer, the etch can concern only the second end point layer 42b of polysilicon, which may have been damaged during the step of laser irradiation, and the first end point layer 42a can be used as gate oxide of the MOS device. In this case, the manufacturing process may not contemplate the step of dedicated formation of the gate-oxide layer 47. In any case, a polysilicon layer 48, possibly doped, is then formed (for example by deposition), for making the gate electrodes of the MOS device, and the gate structures 26 are formed in a way similar to what was described previously in relation to the second embodiment.

In all of the embodiments described above, in the resulting MOS device 40 the dielectric mirror 10 has the function of insulating the gate electrodes and the drain electrode of the MOS device and the function of intercell thick dielectric between adjacent gate structures, with the advantage of reducing the capacitances between the gate and drain electrodes of the MOS device. Furthermore, the second and third embodiments described can advantageously be used in all vertical-conduction planar MOS structures (for example, power MOSs, IGBTs, MCTs). These embodiments can be used also in the case where the starting layer of semiconductor material is constituted by a semiconductor material other than silicon, for example silicon carbide (SiC). In this regard, as is known, for activation and diffusion of the dopants in the silicon carbide, temperatures higher than the melting point of silicon are necessary, so that it is extremely advantageous to form the gate structures (or part of the gate structures in the case where the end point layer 42 is used in part as gate oxide) subsequent to the steps of activation and annealing of the body and source regions.

The advantages of the described manufacturing process emerge clearly from the foregoing description.

In any case, the use of the dielectric mirror 10 in the process for manufacturing the MOS device 40 enables protection of the structures previously formed by the laser irradiation for the annealing of the doped source/drain regions. In this way, it is possible to use high energies of irradiation (even higher than 1 J/cm$^2$), so as to obtain a complete elimination of the implantation defects and at the same time prevent damage to the structure of the MOS device, in particular, to the gate structures.

Furthermore, as described, the presence of the dielectric mirror 10 as an element of insulation in the final MOS device, is advantageous in all the embodiments described. In particular, in the first embodiment, the dielectric mirror enables insulation between the gate electrodes and the source/drain contacts to be obtained, whilst in the second and third embodiments, the dielectric mirror enables a significant reduction in the capacitances of the gate electrodes, acting as thick intercell dielectric.

Advantageously, the dielectric mirror 10 can be used for obtaining both vertical-conduction and lateral-conduction MOS devices (in accordance with the respective process variants).

In particular, the dopant species used for the implants can be reversed for producing P-channel, instead of N-channel, devices.

Furthermore, a different type of excimer laser can be used for the process of annealing, for example an XeF laser (at a wavelength $\lambda$ of 351 nm), KrF ($\lambda$=248 nm), or ArF ($\lambda$=193 nm), or other types of laser at a wavelength lying in the spectrum of the ultraviolet. Clearly, by varying the laser used, the thickness of the layers that constitute the dielectric mirror will consequently vary, according to the laws previously described.

Finally, the layer of semiconductor material 20, within which the active areas of the MOS device are formed, can be an epitaxial layer grown on top of a substrate, the substrate and the epitaxial layer possibly having the same type of conductivity and different doping concentrations, or possibly different types of conductivity.

MOS devices according to embodiments of the present disclosure can be utilized in a variety of different types of integrated circuits, such as in power-related integrated circuits where the MOS device is a VDMOS or a IGBT. These MOS devices can, in turn, be contained in a variety of different types of electronic systems, such as computer systems, automotive systems, and so on.

From the foregoing it will be appreciated that, although specific embodiments of the disclosure have been described herein for purposes of illustration, various modifications may be made without deviating from the spirit and scope of the disclosure.

The invention claimed is:

1. A MOS device comprising:
   a semiconductor body having at least one contiguous surface with at least a first surface portion and a second surface portion facing the same direction;
   a gate structure arranged above said semiconductor body and including a gate electrode; and
   a first doped region, formed within the first surface portion of said semiconductor body, at the sides of and partially underneath said gate structure; and
   a dielectric mirror arranged above the second surface portion of said semiconductor body, such that the first surface portion is configured to be exposed to electromagnetic radiation.

2. The device according to claim 1, wherein said dielectric mirror is insulating and is arranged in a position adjacent to said gate electrode so as to insulate said gate electrode.

3. The MOS device of claim 1, wherein said dielectric mirror is a Bragg reflector and comprises a plurality of pairs of a first mirror layer and a second mirror layer, set on top of one another; said first mirror layer and said second mirror layer having, respectively, a first refractive index and a second refractive index, which are different from one another.

4. The MOS device of claim 1 wherein said dielectric mirror is set above said gate electrode; further comprising a first electrical-contact structure, in electrical contact with said first doped region and set above said dielectric mirror.

5. The device according to claim 1, wherein said dielectric mirror is set in an area corresponding to said semiconductor layer, and said gate electrode is set at least in part above, and in contact with, said dielectric mirror.

6. The device according to claim 5, wherein said gate structure further comprises a gate dielectric layer set on said semiconductor layer, laterally in contact with said dielectric mirror.

7. The device according to claim 5, further comprising an end point layer on said semiconductor layer, comprising dielectric material, said dielectric mirror being arranged on said end point layer; and wherein said gate structure further comprises part of said end point layer.

8. The device according to claim 1, wherein said semiconductor body comprises one between: silicon and silicon carbide.

9. A MOS device comprising:
a semiconductor body;
a gate structure arranged above said semiconductor body and including a gate electrode; and
a first doped region, formed within a first surface portion of said semiconductor body, at the sides of and partially underneath said gate structure; and
a dielectric mirror arranged above a second surface portion of said semiconductor body;
wherein said dielectric mirror is a Bragg reflector and comprises a plurality of pairs of a first mirror layer and a second mirror layer, set on top of one another; said first mirror layer and said second mirror layer having, respectively, a first refractive index and a second refractive index, which are different from one another; and
further comprising a buffer region on said dielectric mirror, said buffer region having optical characteristics such as not to reduce a reflectivity of said dielectric mirror.

10. The device according to claim 9, further comprising a capping region on said buffer region and above said first surface portion of said semiconductor layer, said capping region having optical characteristics such as to improve an energy coupling with an incident electromagnetic radiation, and not to reduce a reflectivity of said dielectric mirror.

11. A MOS device comprising:
a semiconductor body;
a gate structure arranged above said semiconductor body and including a gate electrode; and
a first doped region, formed within a first surface portion of said semiconductor body, at the sides of and partially underneath said gate structure; and
a dielectric mirror arranged above a second surface portion of said semiconductor body;
wherein said dielectric mirror is set above said gate electrode; further comprising a first electrical-contact structure, in electrical contact with said first doped region and set above said dielectric mirror;
wherein said semiconductor body has a first type of conductivity, further comprising:
a second doped region having a second type of conductivity set within said semiconductor body, at the sides of, and partially underneath, said gate structure, said first doped region being set within said second doped region, and having said first type of conductivity; and
first spacers, made of insulating material, set at the sides of said gate structure and of said dielectric mirror,
said first electrical-contact structure being in electrical contact also with said second doped region.

12. The device according to claim 11, further comprising a first conductive region set between said gate electrode and said dielectric mirror; said first conductive region compris-ing, in particular, a metal or a metallic silicide, chosen preferably in the group comprising: W, Mo, Ti, Ta, $CoSi_x$, $PtSi_x$, $TiSi_x$, $WSi_x$.

13. The device according to claim 11, in which said first doped region has a lateral extension smaller than a principal dimension of said second doped region, and said first electrical-contact structure is set above, and directly in contact with, said first doped region and said second doped region.

14. The device according to claim 11, further comprising a cavity made within said semiconductor body and having a depth greater than a depth of said first doped region and such as to reach said second doped region; said first electrical-contact structure being set partially within said cavity.

15. A MOS device comprising:
a semiconductor body;
a gate structure arranged above said semiconductor body and including a gate electrode; and
a first doped region, formed within a first surface portion of said semiconductor body, at the sides of and partially underneath said gate structure; and
a dielectric mirror arranged above a second surface portion of said semiconductor body;
wherein said dielectric mirror is set in an area corresponding to said semiconductor layer, and said gate electrode is set at least in part above, and in contact with, said dielectric mirror; and
wherein said semiconductor body has a first type of conductivity, further comprising a second doped region having a second type of conductivity arranged within said semiconductor body, at the sides of, and partially underneath, said gate structure, said first doped region being set within said second doped region and having said first type of conductivity; said gate electrode comprising one between:
first gate portions set laterally in contact with said dielectric mirror, and extending above said first and second doped regions; or
in addition to said first gate portions, second gate portions set on said dielectric mirror; or
a single gate portion set laterally in contact with, and above, said dielectric mirror, and extending above said first doped region and said second doped region.

16. A structure formed on a semiconductor layer, comprising:
a gate structure formed over the semiconductor layer;
first doped regions formed within respective first portions of the semiconductor layer; and
a dielectric mirror formed over a second portion of the substrate, the dielectric mirror being positioned between and not over adjacent first portions.

17. The structure of claim 16 wherein the dielectric mirror is formed over the gate structure.

18. The structure of claim 16 wherein the gate structure is formed over respective third portions of the semiconductor layer and adjoining a sidewall portion of the dielectric mirror, the third portions being positioned respectively between the second portion and the first portions and corresponding to channel regions of the device.

19. The structure of claim 16 wherein the structure comprises a MOS transistor.

20. The structure of claim 19 wherein the MOS transistor comprises a VDMOS or IGBT transistor.

21. An electronic system, comprising:
an electronic subsystem including a MOS device formed on an approximately flat semiconductor layer, the MOS device including,
a gate structure formed over the semiconductor layer;

first doped regions formed within respective first portions of the semiconductor layer; and a dielectric mirror formed over a second portion of the substrate, the dielectric mirror being positioned between and not over adjacent first portions.

22. The electronic system of claim 21 wherein the subsystem comprises a computer system.

\* \* \* \* \*